US007030959B2

(12) United States Patent
Sogard

(10) Patent No.: US 7,030,959 B2
(45) Date of Patent: Apr. 18, 2006

(54) EXTREME ULTRAVIOLET RETICLE PROTECTION USING GAS FLOW THERMOPHORESIS

(75) Inventor: Michael Sogard, Menlo Park, CA (US)

(73) Assignee: Nikon Corporation, Tokyo (JP)

(*) Notice: Subject to any disclaimer, the term of this patent is extended or adjusted under 35 U.S.C. 154(b) by 56 days.

(21) Appl. No.: 10/898,475

(22) Filed: Jul. 23, 2004

(65) Prior Publication Data

US 2006/0017895 A1 Jan. 26, 2006

(51) Int. Cl.
*G03B 27/52* (2006.01)
*G03B 27/42* (2006.01)
*G03B 27/62* (2006.01)
*F26B 5/04* (2006.01)
*H01L 21/302* (2006.01)

(52) U.S. Cl. .......................... 355/30; 355/53; 355/75; 340/403; 438/795

(58) Field of Classification Search ................. 355/30, 355/53, 72, 75; 359/507, 509, 512; 430/5; 34/403; 438/795
See application file for complete search history.

(56) References Cited

U.S. PATENT DOCUMENTS 6,106,634 A * 8/2000 Ghanayem et al. ........... 134/19
6,110,844 A 8/2000 Rader et al.
6,153,044 A 11/2000 Klebanoff et al.
6,232,578 B1 * 5/2001 Klebanoff et al. .......... 219/228
6,253,464 B1 7/2001 Klebanoff et al.
6,492,067 B1 * 12/2002 Klebanoff et al. ............. 430/5
2005/0023187 A1 * 2/2005 Golda ........................ 206/710

FOREIGN PATENT DOCUMENTS

JP 09-253441 9/1997

OTHER PUBLICATIONS

Rader, Daniel J., Verification studies of Thermophoretic for EUV masks, Emerging Lithographic Technologies VI, 2002, SPEI vol. 4688.

* cited by examiner

*Primary Examiner*—Alan Mathews
(74) *Attorney, Agent, or Firm*—Aka Chan LLP

(57) ABSTRACT

Methods and apparatus for using a flow of a relatively cool gas to establish a temperature gradient between a reticle and a reticle shield to reduce particle contamination on the reticle are disclosed. According to one aspect of the present invention, an apparatus that reduces particle contamination on a surface of an object includes a plate and a gas supply. The plate is positioned in proximity to the object such that the plate, which has a second temperature, and the object, which has a first temperature, are substantially separated by a space. The gas supply supplies a gas flow into the space. The gas has a third temperature that is lower than both the first temperature and the second temperature. The gas cooperates with the plate and the object to create a temperature gradient and, hence, a thermophoretic force that conveys particles in the space away from the object.

38 Claims, 10 Drawing Sheets

EXTREME ULTRAVIOLET RETICLE PROTECTION USING GAS FLOW THERMOPHORESIS

BACKGROUND OF THE INVENTION

1. Field of Invention

The present invention relates generally to equipment used in semiconductor processing. More particularly, the present invention relates to a mechanism which is arranged to reduce the amount of particle contamination on a reticle used in an extreme ultraviolet lithography system.

2. Description of the Related Art

In photolithography systems, the accuracy with which patterns on a reticle are projected off of or, in the case of extreme ultraviolet (EUV) lithography, reflected off of the reticle onto a wafer surface is critical. When a pattern is distorted, as for example due to particle contamination on a surface of a reticle, a lithography process which utilizes the reticle may be compromised. Hence, the reduction of particle contamination on the surface of a reticle is crucial.

Photolithography systems typically use pellicles to protect reticles from particles. As will be appreciated by those skilled in the art, a pellicle is a thin film on a frame which covers the patterned surface of the reticle to prevent particles from becoming attached to the patterned surface. Pellicles, however, are not used to protect EUV reticles, since thin films generally are not suitable for providing protection in the presence of EUV radiation. Principles of thermophoresis may also be applied to protect reticles from particle contamination by maintaining reticles at a higher temperature than their surroundings, and, therefore, causing the particles to move from the hotter reticle to the cooler surroundings, e.g., cooler surfaces.

Since thermophoresis generally may not be used in a high vacuum environment, in order for thermophoresis to be used in an EUV system to protect a reticle mounted in a reticle chuck, gas at a pressure of approximately fifty milliTorr (mTorr) or more may be introduced to substantially flow around the reticle. With the gas at a pressure of approximately fifty mTorr or more flowing around the reticle, particles may be effectively pushed away from the reticle towards a cooler surface. As will be appreciated by those skilled in the art, at pressures close to zero, thermophoretic forces are relatively insignificant. However, at low pressures of approximately fifty mTorr, thermophoretic forces are generally significant enough to convey particles from a hotter area to a cooler area.

FIG. 1 is a diagrammatic side view representation of a portion of an EUV lithography or exposure system. An EUV lithography system 100 includes a chamber 104 which includes a first region 108 and a second region 110. First region 108 is arranged to house a reticle stage 114 which supports a reticle chuck 118 that holds a reticle 122. Second region 110 is arranged to house projection optics (not shown) and a wafer stage arrangement (not shown). Sections 108, 110 are substantially separated by a differential pumping barrier 126 through which an opening 130 is defined.

Gas at a pressure of around fifty mTorr or more is supplied to first region 108 through a gas supply opening 132 in chamber 104. In order for EUV radiation absorption losses in the gas to be minimized, second region 110 is maintained at a lower pressure, e.g., less than approximately one mTorr, than the pressure maintained in first region 108. Hence, independent differential pumping of first region 108 and second region 110 is maintained by pump 134 and pump 136, respectively, so that the pressure in second region 110 may be maintained at approximately one mTorr or less while gas of a higher pressure is supplied through opening 130 into first region 108.

In order for particles (not shown) located between reticle 122 and barrier 126 to be conveyed away from reticle 122 by the gas using the principles of thermophoresis, a temperature differential must be maintained between reticle 122 and the surroundings of reticle 122. Typically, in order for thermophoresis to convey particles away from reticle 122, reticle 122 is maintained at a higher temperature than barrier 126. When reticle 122 is maintained at a higher temperature than barrier 126, particles (not shown) present between reticle 122 and barrier 126 may be attracted towards barrier 126, as will be discussed below with respect to FIG. 2. In come cases, particles (not shown) that are attracted towards barrier 126 may pass into second region 110 through opening 130. The flow of gas from region 108 to region 110 will also convey particles away from reticle 122, which helps in keeping particles from coming into contact with reticle 122.

With reference to FIG. 2, the use of thermophoresis to substantially repel particles away from the surface of a reticle will be described. A reticle 222, which is maintained at a first temperature, may be positioned in proximity to a cooler surface 226. Cooler surface 226 may be a differential pumping barrier in a chamber used in EUV lithography, or may be a shield which is arranged to protect reticle 222. A variation in gas temperature is generally formed between reticle 222 and cooler surface 226 that goes from being relatively warm near reticle 222 to being relatively cool near cooler surface 226. This creates a temperature gradient in the gas which is an essential condition for the existence of thermophoresis. Particles 228 are generally repelled from reticle 222 towards cooler surface 226. That is, thermophoretic forces are such that particles are driven away from the hotter reticle 222 towards cooler surface 226. Some particles 228 may become substantially attached to cooler surface 226.

While the positioning of a surface in proximity to a reticle that is cooler than the reticle reduces particle contamination of the reticle, maintaining surfaces of different temperatures within an EUV apparatus is often problematic. For example, maintaining surfaces at different temperatures may complicate temperature control of critical systems. In addition, issues relating to thermal expansion and distortion typically arise when a reticle and adjacent components are maintained at different temperatures. When there is thermal expansion or distortion within an EUV apparatus, e.g., with respect to a reticle or a shield, the integrity of an overall lithography process or, more generally, a semiconductor fabrication process may be compromised. Also, the flow of gas from region 108 of chamber 104 to region 110 may sweep particles originating in region 108 into proximity with reticle 122, thereby increasing the risk of contamination despite the protection afforded by thermophoresis.

Therefore, what is desired is a system which allows an EUV reticle to be efficiently and effectively protected from particle contamination substantially without adversely affecting an overall EUV lithography process. That is, what is needed is a system which enables a reticle such as an EUV reticle to be protected from particle contamination without a significant risk of thermal expansion and distortion issues arising.

SUMMARY OF THE INVENTION

The present invention relates to using a flow of a relatively cool gas to establish a temperature gradient between a reticle and a reticle shield such that particle contamination on the reticle may be reduced. According to one aspect of the present invention, an apparatus that reduces particle contamination on a surface of an object includes a member having a surface proximate to the object, e.g., a plate, and a gas supply. The plate is arranged to be positioned in proximity to the object such that the plate, which is of a second temperature, and the object, which is of a first temperature, are substantially separated by a space. The gas supply supplies a gas flow to the space. The gas is of a third temperature that is lower than the first temperature and lower than the second temperature. Heat flow between the gas, the plate, and the object create a temperature gradient in the gas and, hence, a thermophoretic force that is suitable for conveying particles in the space away from the object.

In one embodiment, the plate includes at least a first opening defined therein that enables the gas flow to pass therethrough and into the space. In such an embodiment, the plate may also include a second opening defined therein. The second opening enables the gas flow to pass therethrough and out of the space to convey the particles in the space away from the object and away from the plate.

Allowing a reticle and a nearby surface, e.g., a reticle shield, to remain at substantially the same temperature while allowing for thermophoretic effects to convey particles away from the reticle reduces particle contamination without causing relatively significant thermal distortion effects and performance issues. By maintaining a reticle and a nearby surface at substantially the same temperature while providing a cooled or chilled gas in a space between the reticle and the nearby surface, a temperature gradient may be created between the reticle and the nearby surface. The presence of the temperature gradient allows thermophoretic forces to convey particles away from both the reticle and the nearby surface. The source of the gas is local, and the gas may be locally filtered, so the likelihood of the gas sweeping additional particles into the vicinity of the reticle is quite small.

According to another aspect of the present invention, a method for reducing particle contamination on a surface of an object includes providing a shield in proximity to the surface of the object that is positioned such that there is a space defined between the surface of the object and the shield. The shield has a first opening defined therein, and the surface of the object is of a first temperature while the shield is of a second temperature. The method also includes providing a flow of a gas in the space defined between the surface of the object and the shield, the gas being of a third temperature that is lower than both the first temperature and the second temperature. The flow of the gas is provided through the first opening.

In one embodiment, the flow of the gas in the space creates a temperature gradient in the space that enables the flow of the gas to convey any particles in the space away from the surface of the object. In another embodiment, providing the flow of the gas in the space includes cooling the gas to the third temperature and controlling the amount of the gas that flows through the first opening.

According to still another aspect of the present invention, an apparatus arranged to reduce particle contamination on a surface of an object includes a chamber, a first scanning arrangement, and a gas supply. The chamber has a first region and a second region where the first region has a pressure of at least approximately 50 mTorr while the second region has a pressure that is less than the pressure of the first region. The first scanning arrangement scans the object, and is positioned in the first region. The first scanning arrangement includes a plate that is arranged in proximity to a first surface of the object such that a first surface of the plate and the first surface of the object are substantially separated by a space in the first region. The first surface of the object is of a first temperature and the first surface of the plate is of a second temperature. The gas supply supplies a gas flow to the space. The gas is at a third temperature that is lower than the first temperature and lower than the second temperature, and cooperates with the plate and the object to create a thermophoretic force to convey any particles in the space away from the object.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which.

DETAILED DESCRIPTION OF THE EMBODIMENTS

Particle contamination on critical surfaces of reticles such as reticles used in extreme ultraviolet (EUV) lithography systems may compromise the integrity of semiconductors created using the reticles. Hence, protecting critical surfaces of reticles from airborne contaminants is important to ensure the integrity of lithography processes. Some reticles are protected from airborne particles through the use of pellicles. However, pellicles are not suitable for use in protecting surfaces of EUV reticles. While thermophoresis is also effective in protecting reticle surfaces from particle contamination when at least a slight gas pressure is present, maintaining a surface that is in proximity to a reticle at a lower temperature than that of the reticle to enable thermophoretic forces to act often causes thermal expansion and distortion within an overall EUV lithography system.

By introducing a gas that flows between a reticle and a nearby surface, e.g., a reticle shield, that is at a cooler temperature than those of the reticle and the nearby surface, thermophoresis may be used to convey particles away from the reticle while the reticle may be maintained at substantially the same temperature as the nearby surface. The cooler gas will typically establish local temperature gradients adjacent to both the reticle and the nearby surface, thereby establishing thermophoretic forces which will effectively sweep particles away from both the reticle and the nearby surface. Since the reticle and the nearby surface are maintained at substantially the same temperature, particle contamination of the reticle may be reduced, while the potential for thermal expansion and distortion effects is also significantly reduced.

Figure 1:
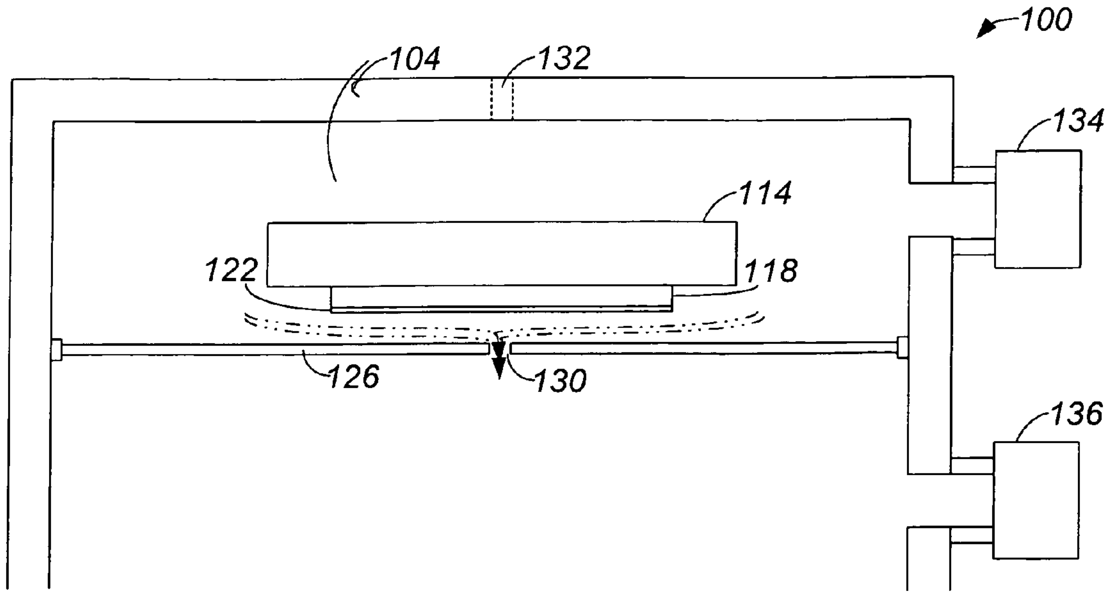
FIG. 1 is a diagrammatic side view representation of a portion of an extreme ultraviolet lithography or exposure system.
Figure 2:
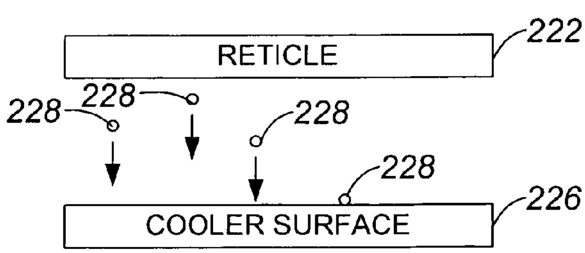
FIG. 2 is a diagrammatic representation of a reticle, a nearby surface, and particles which are attracted away from the reticle through the use of thermophoresis.
Figure 3A:
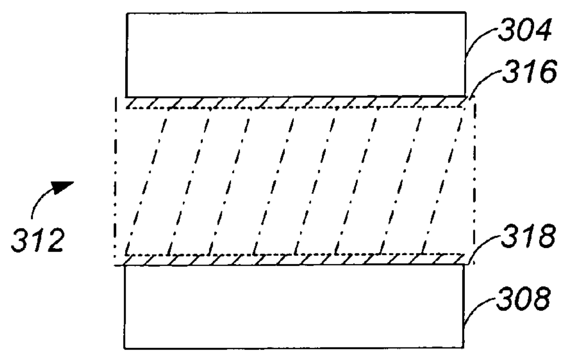
FIG. 3*a* is a diagrammatic representation of the layers of gas flow between a reticle and a reticle shield in accordance with an embodiment of the present invention.
Figure 3B:
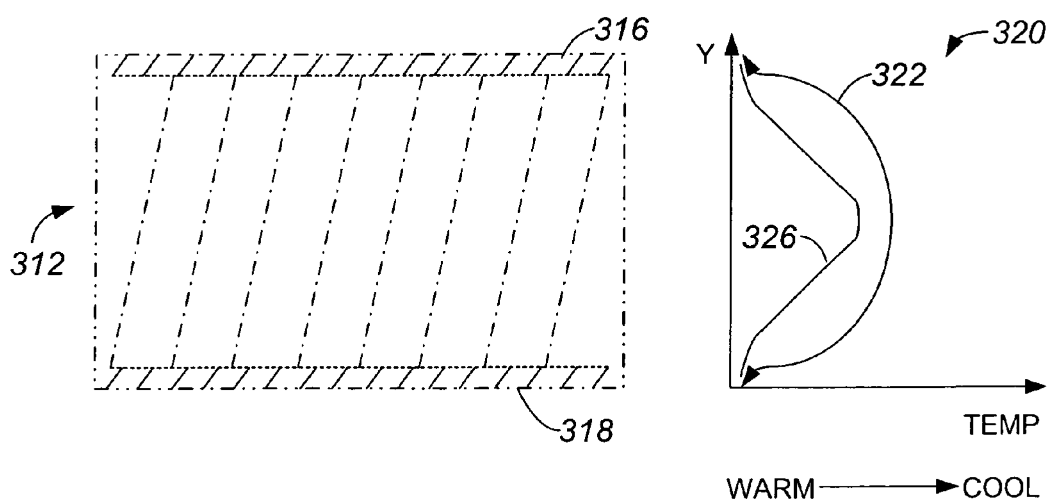
FIG. 3*b* is a diagrammatic representation a temperature gradient associated with a gas located between a reticle and a reticle shield in accordance with an embodiment of the present invention.

The introduction of a gas between a surface of a reticle and a surface of a reticle shield at a temperature that is cooler than the temperatures of the reticle and the reticle shield allows a temperature gradient to be formed in the gas between the reticle and the reticle shield. With reference to FIGS. 3*a* and 3*b*, the formation of a temperature gradient between the reticle and the reticle shield will be described in accordance with an embodiment of the present invention. As shown in FIG. 3*a*, when a cooled gas 312 is substantially introduced between a reticle 304 and a surface 308 near reticle 304, as for example a reticle shield, a boundary layer 316 is formed near a surface of reticle 304 and a boundary layer 318 is formed near surface 308. Boundary layers 316, 318 are generally warmer than the rest of cooled gas 312, as will be understood by those skilled in the art, since the gas in boundary layers 316, 318 may be partially heated by reticle 304 and surface 308, respectively.

Cooler gas 312 typically establishes local temperature gradients 320, and cause thermophoretic forces to be established which will generally cause particles to move away from reticle 304 and surface 308, and effectively be swept into the flow of cooled gas 312. Hence, particle contamination of reticle 304 as well as particle contamination of surface 308 may be reduced.

FIG. 3*b* is a diagrammatic representation of cooled gas between a reticle and a nearby surface, e.g., cooled gas 312 of FIG. 3*a*, and a temperature gradient in accordance with an embodiment of the present invention. A temperature gradient 320 associated with cooled gas 312 may be such that the temperature distribution is approximately gaussian, as indicated by distributions 326, with the coolest temperature being substantially midway between boundary layer 316 and boundary layer 318. More generally, the temperature distribution is such that the coolest temperature is approximately halfway between boundary layer 316 and boundary layer 318, while the warmest temperatures are at boundary layer 316 and boundary layer 318, as indicated at 322. It should be appreciated that the actual profile of a temperature distribution may vary widely.

Figure 4A:
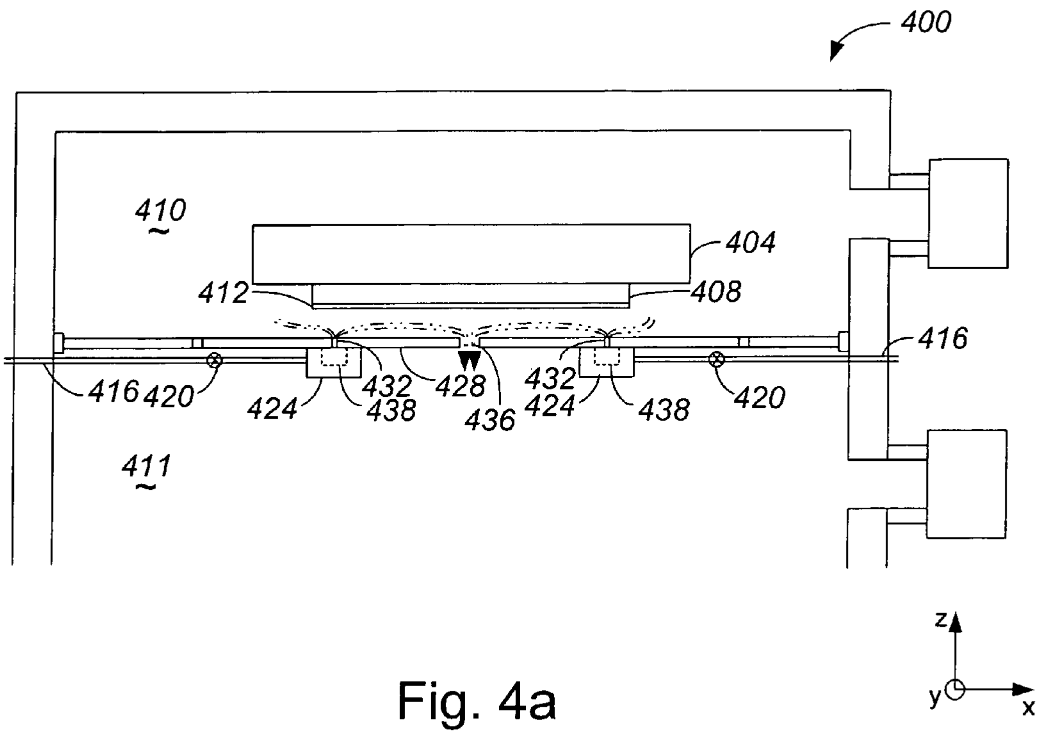
FIG. 4*a* is a diagrammatic cross-sectional side view representation of a portion of an EUV lithography chamber which uses a cooled gas to create thermophoretic forces in accordance with an embodiment of the present invention.

A cooled gas such as cooled gas 312 may be introduced into an EUV lithography apparatus using a gas source or supply that is substantially external to the apparatus. FIG. 4*a* is a diagrammatic cross-sectional side view representation of a portion of an EUV lithography chamber which uses a cooled gas to create thermophoretic forces in accordance with an embodiment of the present invention. An EUV lithography chamber 400 includes a first region 410 and a second region 411 that are substantially separated by a differential pumping barrier 428 or a reticle shield. A pressure of approximately fifty milliTorr (mTorr) or more is maintained in first region 410, while a pressure of less than approximately 1 mTorr, i.e., a near vacuum, is maintained in second region 411.

A reticle 412, which is held by a reticle chuck 408 that is coupled to a reticle stage arrangement 404, and barrier 428 are maintained at approximately the same temperature. A gas which is supplied by gas supplies 416 and is cooled using coolers 424 may be introduced through openings 432 into a space between reticle 412 and barrier 428. The flow of the gas is typically laminar, and may be controlled by gas flow controllers 420. In one embodiment, filters 438 may be used to filter particles out of the gas as the gas passes through openings 432 into the space between reticle 412 and barrier 428.

Figure 4B:
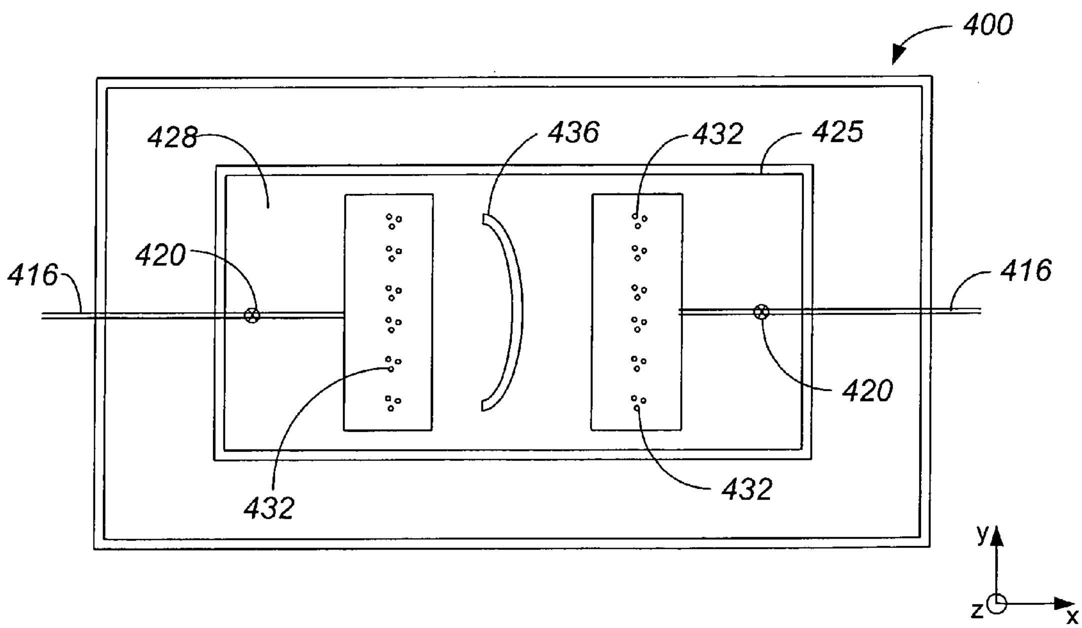
FIG. 4*b* is a diagrammatic bottom view of one configuration of openings, i.e., openings 432 of FIG. 4*a*, through which a gas may flow between a reticle and a barrier in accordance with an embodiment of the present invention.
Figure 4C:
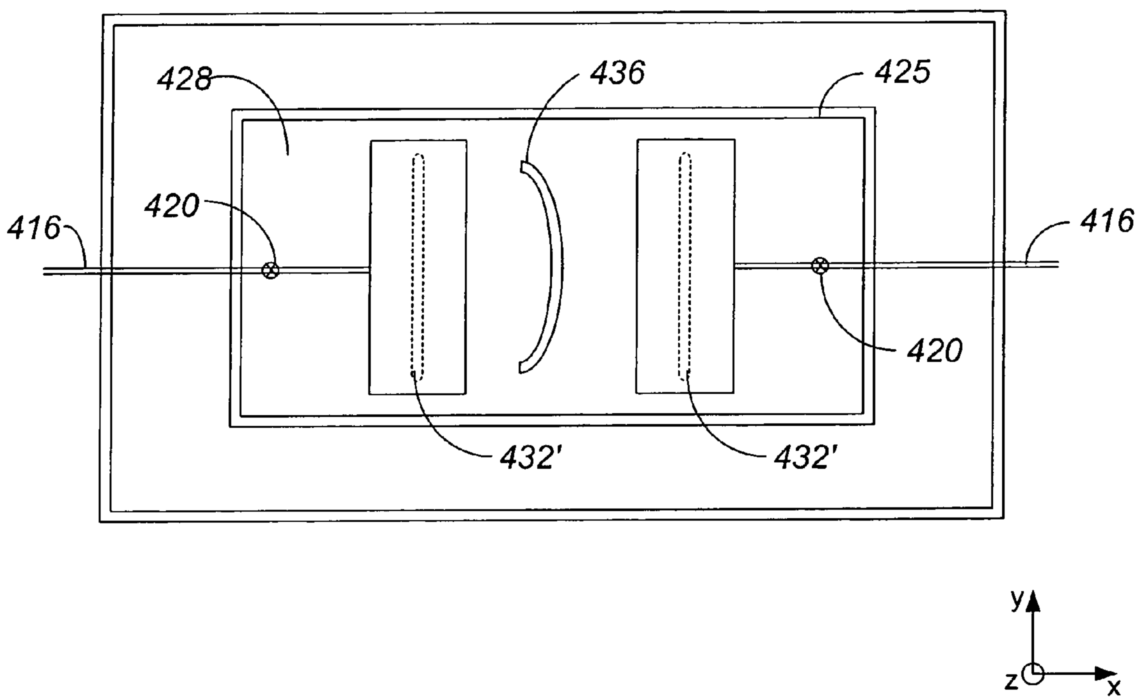
FIG. 4*c* is a diagrammatic bottom view of another configuration of openings, i.e., openings 432 of FIG. 4*a*, through which a gas may flow between a reticle and a barrier in accordance with an embodiment of the present invention.

Openings 432 may generally be slots or orifices of various shapes and sizes. As shown in FIG. 4*b*, openings 432 may be a series of substantially round openings. Alternatively, openings 432' may be slots as shown in FIG. 4*c*. It should be appreciated that the number of openings 432, as well as the size and the shapes of openings 432, may vary widely. In general, the shape and the configuration of openings 432 may be chosen to enable a laminar flow of gas to be efficiently established.

Gas that flows through openings 432 into the space between reticle 412 and barrier 428 establishes local temperature gradients adjacent to reticle 412 and barrier 428, and causes thermophoretic forces to convey particles away from reticle 412 and barrier 428. The particles may be conveyed through an opening, or differential pumping aperture 436, defined within barrier 428 which is generally arranged for an EUV beam to pass through. It should be appreciated that although gas may escape from between reticle 412 and barrier 428 and into the remainder of first region 410 or into second region 411, the amount of gas that escapes is typically not excessive enough to significantly alter the pressure in first region 410 or to compromise the vacuum in second region 411.

The gas introduced between reticle 412 and barrier 428 may be a light gas such as helium or hydrogen. In general, the gas is a pure gas that absorbs EUV radiation. In addition to being a light gas such as helium or hydrogen, the gas may be argon or nitrogen. Since nitrogen is relatively inexpensive, and is used in gas bearings (not shown) which are typically a part of reticle stage arrangement 404, nitrogen may often be used as the gas introduced between reticle 412 and barrier 428.

During lithographic exposure, reticle 412 is scanned back and forth above the opening 436 by means of reticle stage arrangement 404. As reticle 412 scans, variations in temperature, and therefore thermophoretic force, that are caused by the gas, i.e., the cooled gas, warming up as the gas flows in contact with reticle 412 and barrier 428 may generally be substantially averaged out. Such a warming of the gas may be at least partially compensated for by the thermodynamic cooling of the gas as the gas approaches opening 436, which often results in a temperature drop of the gas.

In order to maintain reticle 412 and barrier 428 at substantially the same constant temperature, as heat is removed by the cold flowing gas, a mechanism (not shown) for effectively heating reticle 412 and barrier 428 may be provided. To facilitate temperature control of barrier 428, thermal insulation 425 may be used to thermally isolate barrier 428 from the surrounding structures. The mechanism for effectively heating reticle 412 and barrier 428 may generally be any suitable mechanism. By way of example, reticle 412 may be sufficiently heated by EUV radiation that passes through opening 436, and no other mechanism may need to be used to heat reticle 412. The removal of heat by the flowing gas is typically proportional to the heat capacity of the gas. Because of the low pressure of the gas, the heat capacity is relatively small, and the amount of heat removed from reticle 412 and barrier 428 is typically not excessive.

Figure 5A:
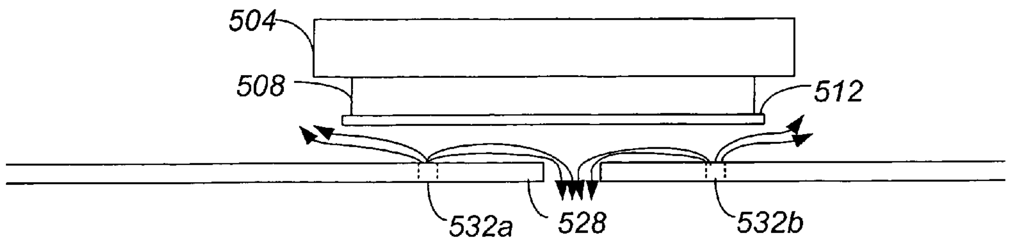
FIG. 5*a* is a diagrammatic representation of a reticle in a first position with respect to a differential pumping barrier in accordance with an embodiment of the present invention.
Figure 5B:
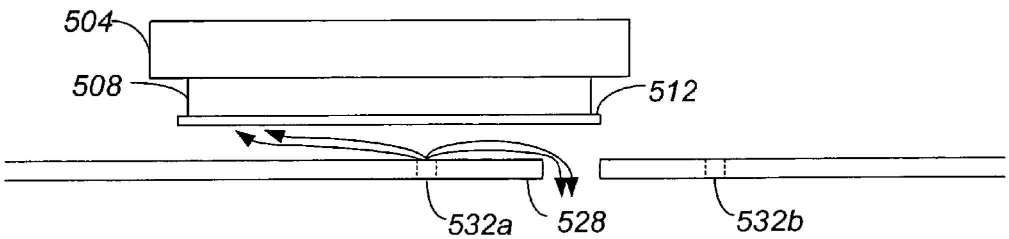
FIG. 5*b* is a diagrammatic representation of a reticle in a second position with respect to a differential pumping barrier, i.e., reticle 512 and differential pumping barrier 528 of FIG. 5*a*, in accordance with an embodiment of the present invention.
Figure 5C:
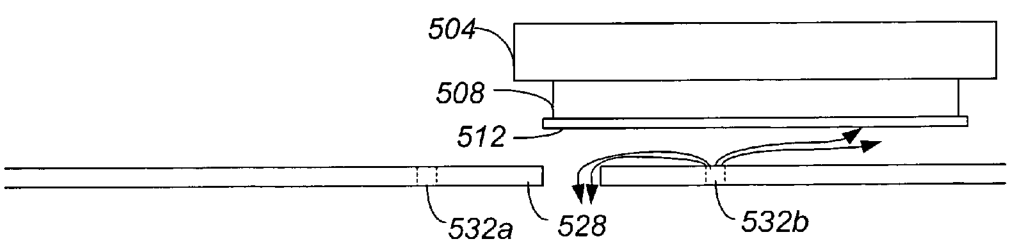
FIG. 5*c* is a diagrammatic representation of a reticle in a third position with respect to a differential pumping barrier, i.e., reticle 512 and differential pumping barrier 528 of FIG. 5*a*, in accordance with an embodiment of the present invention.

To reduce the amount of cooled gas that may effectively escape from between a reticle and a barrier and into a surrounding area, part of the flow of cooled gas may be shut down at times depending upon the positioning of the reticle. For example, when a reticle is near an extreme point of travel, gas flow through an opening or openings which are not effectively covered by the reticle may be shut off. As shown in FIG. 5*a*, when a reticle 512 that is supported by a reticle chuck 508 is scanned by a reticle stage arrangement 504 over a barrier 528 or shield, reticle 512 may be positioned such that openings 532*a*, 532*b* are both effectively covered by reticle 512. However, when reticle 512 is at an extreme point of travel such that opening 532*b* is not effectively covered by reticle 512, as shown in FIG. 5*b*, a gas flow through opening 532*b* may be shut off. Alternatively, when reticle 512 is at another extreme point of travel such that opening 532*a* is not effectively covered by reticle 512, as shown in FIG. 5*c*, a gas flow through openings 532*a* may be shut off. By shutting down the flow of gas through one of openings 532*a*, 532*b* as appropriate, gas may be substantially prevented from being directly pumped into a surrounding environment.

Figure 5D:
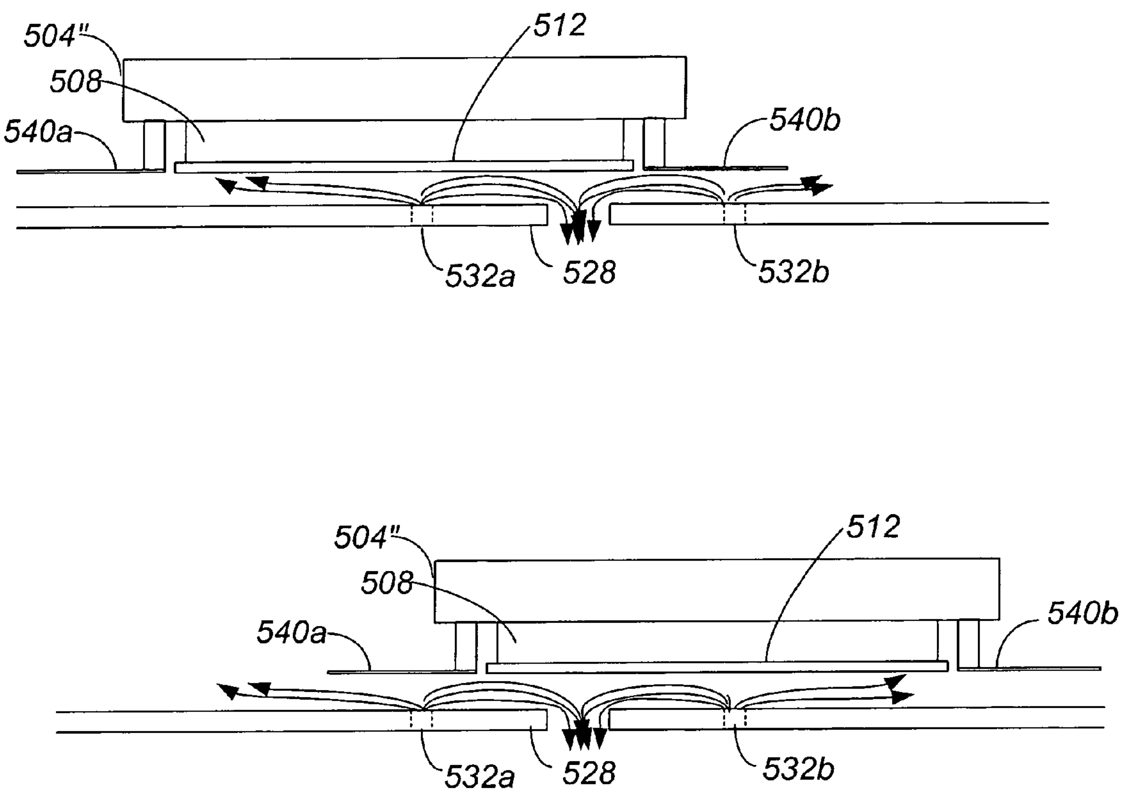
FIG. 5*d* is a diagrammatic representation of a reticle i.e., reticle 512 of FIG. 5*a*, in two extreme positions, illustrating the application of an embodiment of the present invention.

FIG. 5*d* shows another embodiment which reduces the amount of cooled gas escaping from between a reticle and a barrier. Skirts 540*a* and 540*b*, attached to stage arrangement 504", effectively extend the length of reticle 512, so that normal gas flow patterns are maintained even when reticle 512 is at an extreme position of travel. In one embodiment, a surface of skirts 540*a* and 540*b* which opposes barrier 528 is at substantially the same level as a surface of reticle 512 which opposes barrier 528. Such skirts 540*a* and 540*b* experience no forces, save for the acceleration and deceleration of the stage arrangement 504" itself, nor does their location need to be highly precise. Thus, skirts 540*a* and 540*b* may be constructed of very light thin materials, so that their addition has no effect on stage performance.

Figure 5E:
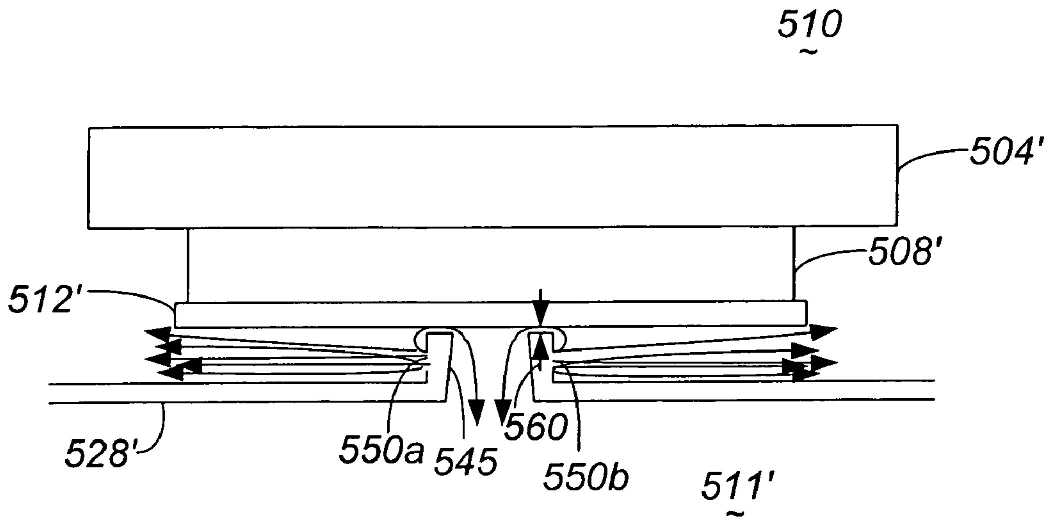
FIG. 5*e* is a diagrammatic side view of a reticle with a second differential pumping barrier in accordance with an embodiment of the present invention.

FIG. 5*e* shows an embodiment which allows less gas flow from the region between a reticle 512' and a barrier 528' into a region 511' below barrier 528'. A nozzle 545 is attached to barrier 528', and a gap 560 between the top surface of nozzle 545 and reticle 512' is reduced to a relatively small value, thereby limiting gas flow into region 511'. Gap 560 may be approximately 1 mm or less, for example. Gas inlets 550*a* and 550*b* installed on nozzle 545 provide a flow of gas largely parallel to the surface of reticle 512'. This flow is largely undisturbed as reticle 512' is scanned back and forth by a stage arrangement 504'. Gas flow into region 510 will typically fluctuate as stage arrangement 504' scans, but the EUV radiation does not pass through region 510, so the fluctuations will not significantly affect the EUV intensity.

Figure 5F:
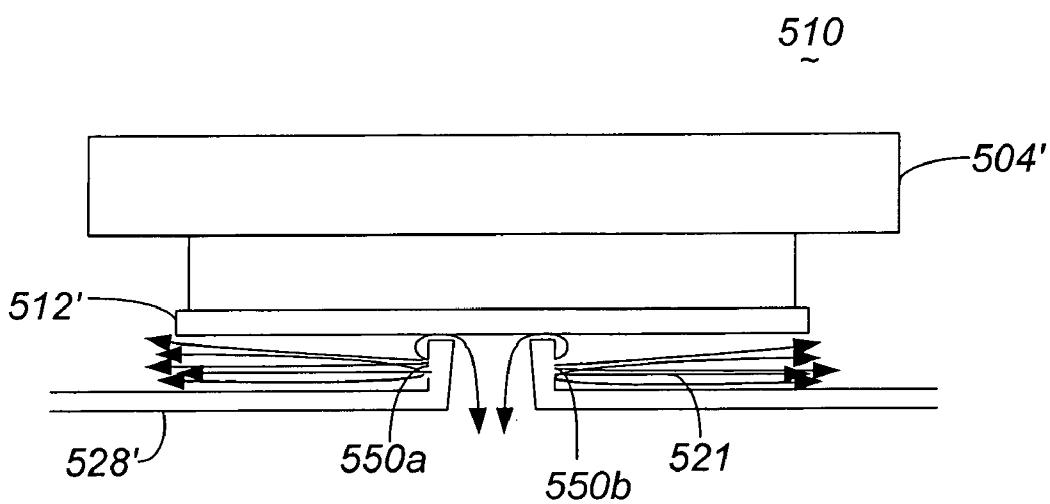
FIG. 5*f* is a diagrammatic side view of yet another embodiment of the present invention.

FIG. 5*f* shows another embodiment of the invention. Gas is introduced into the region 521 between reticle 512' and barrier 528' through gas inlets 550*a* and 550*b*. The gas pressure at the inlets is substantially higher than the ambient gas pressure in region 521 and the ambient pressure in region 510'. Thus the gas expands rapidly out of the inlets and cools significantly in the process. The initial temperature of the gas at the inlets may be adjusted to be warmer than, equal to, or cooler than the temperature of reticle 512' or barrier 528', but as it expands into region 521 a substantial fraction of it becomes cooler than reticle 512' and barrier 528'. Thus the desired temperature gradient in the gas may be established under these conditions without the need to initially cool the supply of gas with a cooler such as 424. In addition the high gas pressure at inlets 550*a*, 550*b* causes the gas flow to achieve a high velocity as it flows through region 521 into region 510'. This imparts a substantial drag force on any particle present which tends to quickly convey it out of region 521 and away from reticle 512'. Thus in this embodiment reticle 512' is protected by both a thermophoretic force arising from the temperature gradient in the gas, and a drag force arising from the high velocity of the gas flow in region 521.

Figure 6:
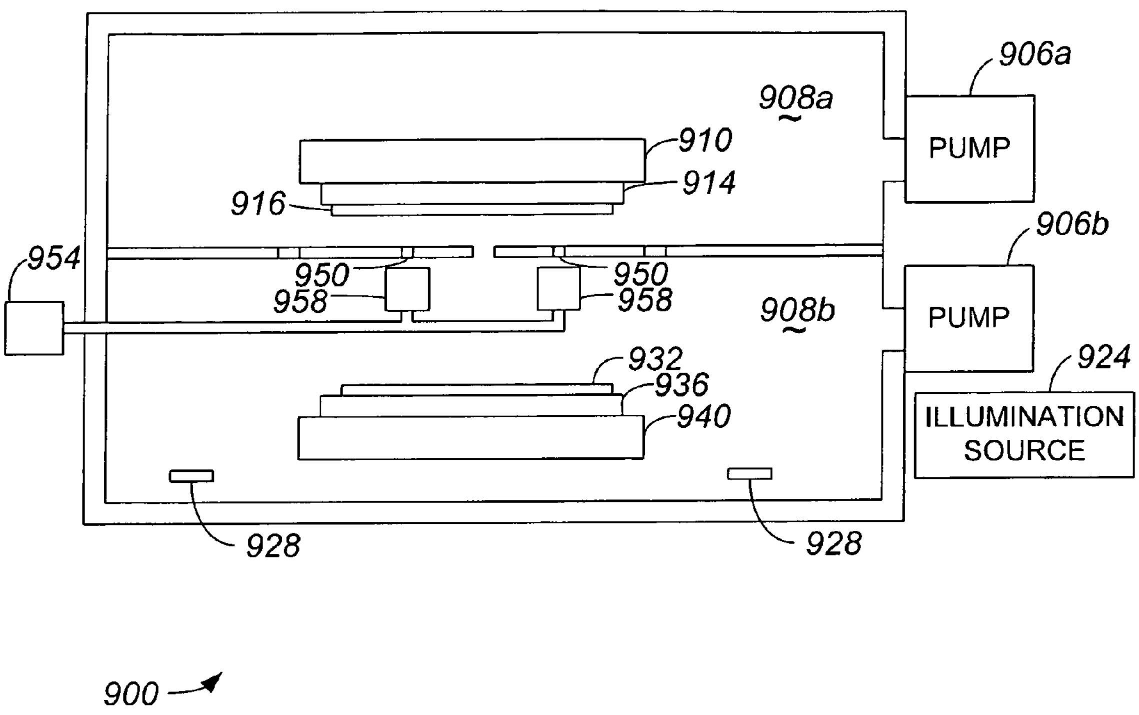
FIG. 6 is a block diagram side-view representation of an EUV lithography system in accordance with an embodiment of the present invention.

With reference to FIG. 6, an EUV lithography system will be described in accordance with an embodiment of the present invention. An EUV lithography system 900 includes a vacuum chamber 902 with pumps 906 which are arranged to enable desired pressure levels to be maintained within vacuum chamber 902. For example, pump 906*b* may be arranged to maintain a vacuum or a pressure level of less than approximately 1 mTorr within a second region 908*b* of chamber 902. Various components of EUV lithography system 900 are not shown, for ease of discussion, although it should be appreciated that EUV lithography system 900 may generally include components such as a reaction frame, a vibration isolation mechanism, various actuators, and various controllers.

An EUV reticle 916, which may be held by a reticle chuck 914 coupled to a reticle stage assembly 910 that allows the reticle to scan, is positioned such that when an illumination source 924 provides beams which subsequently reflect off of a mirror 928, the beams reflect off of a front surface of reticle 916. A reticle shield assembly 920, or a differential barrier, is arranged to protect reticle 916 such that contamination of reticle 916 by particles may be reduced. In one embodiment, reticle shield assembly 920 includes openings 950 through which a cooled gas, which is supplied through a gas supply 954 with a temperature controller 958, may flow.

As discussed above, reticle shield assembly 920 includes an opening through which beams, e.g., EUV radiation, may illuminate a portion of reticle 916. Incident beams on reticle 916 may be reflected onto a surface of a wafer 932 held by a wafer chuck 936 on a wafer stage assembly 940 which allows wafer 932 to scan. Hence, images on reticle 916 may be projected onto wafer 932.

Wafer stage assembly 940 may generally include a positioning stage that may be driven by a planar motor, as well as a wafer table that is magnetically coupled to the positioning stage by utilizing an EI-core actuator. Wafer chuck 936 is typically coupled to the wafer table of wafer stage assembly 940, which may be levitated by any number of voice coil motors. The planar motor which drives the positioning stage may use an electromagnetic force generated by magnets and corresponding armature coils arranged in two dimensions. The positioning stage is arranged to move in multiple degrees of freedom, e.g., between three to six degrees of freedom to allow wafer 932 to be positioned at a desired position and orientation relative to a projection optical system reticle 916.

Movement of the wafer stage assembly 940 and reticle stage assembly 910 generates reaction forces which may affect performance of an overall EUV lithography system 900. Reaction forces generated by the wafer (substrate) stage motion may be mechanically released to the floor or ground by use of a frame member as described above, as well as in U.S. Pat. No. 5,528,118 and published Japanese Patent Application Disclosure No. 8-166475. Additionally, reaction forces generated by motion of reticle stage assembly 910 may be mechanically released to the floor (ground) by use of a frame member as described in U.S. Pat. No. 5,874,820 and published Japanese Patent Application Disclosure No. 8-330224, which are each incorporated herein by reference in their entireties.

An EUV lithography system according to the above-described embodiments, e.g., a lithography apparatus which may include a reticle shield, may be built by assembling various subsystems in such a manner that prescribed mechanical accuracy, electrical accuracy, and optical accuracy are maintained. In order to maintain the various accuracies, prior to and following assembly, substantially every optical system may be adjusted to achieve its optical accuracy. Similarly, substantially every mechanical system and substantially every electrical system may be adjusted to achieve their respective desired mechanical and electrical accuracies. The process of assembling each subsystem into a photolithography system includes, but is not limited to, developing mechanical interfaces, electrical circuit wiring connections, and air pressure plumbing connections between each subsystem. There is also a process where each subsystem is assembled prior to assembling a photolithography system from the various subsystems. Once a photolithography system is assembled using the various subsystems, an overall adjustment is generally performed to ensure that substantially every desired accuracy is maintained within the overall photolithography system. Additionally, it may be desirable to manufacture an exposure system in a clean room where the temperature and humidity are controlled.

Figure 7:
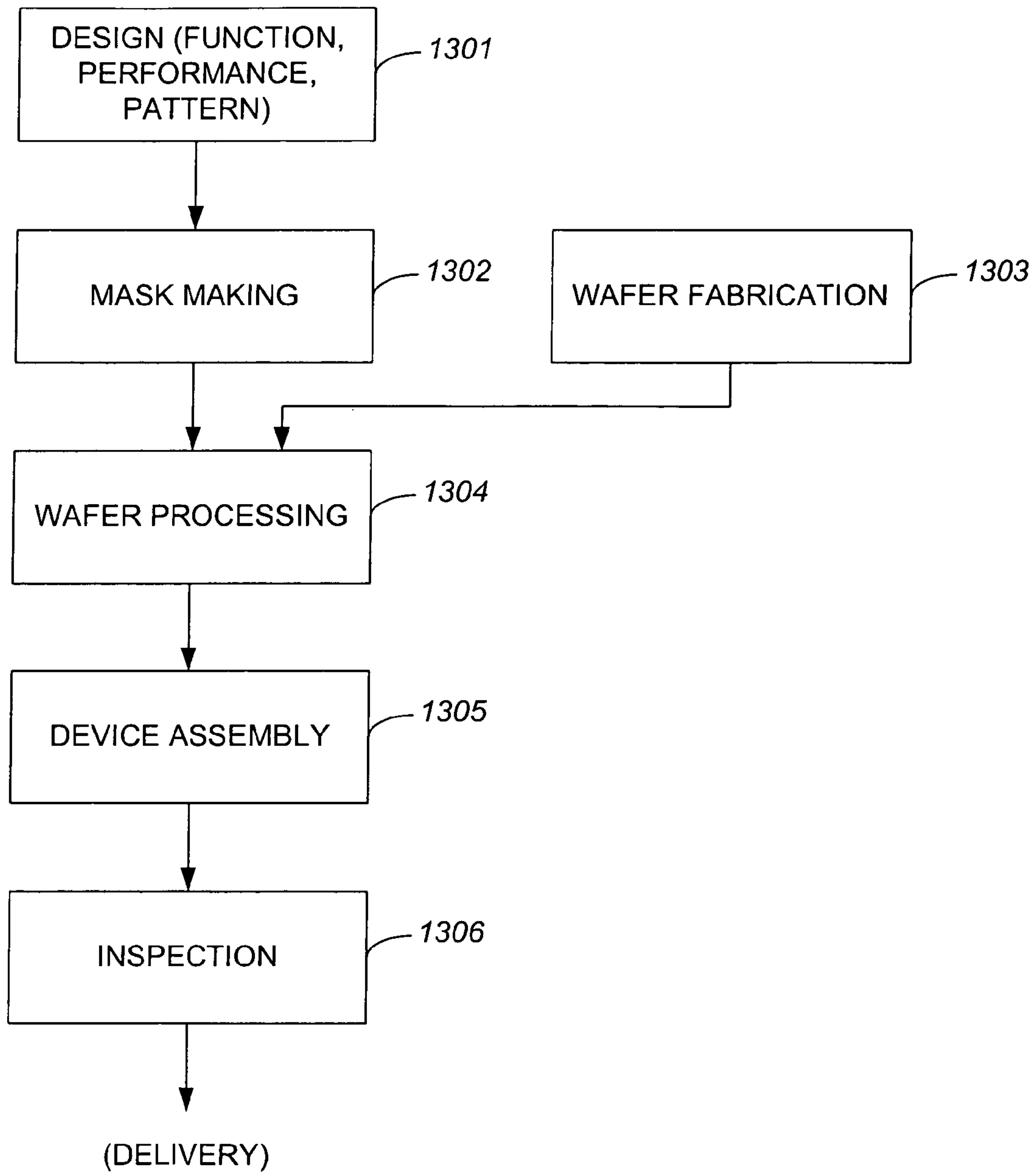
FIG. 7 is a process flow diagram which illustrates the steps associated with fabricating a semiconductor device in accordance with an embodiment of the present invention.

Further, semiconductor devices may be fabricated using systems described above, as will be discussed with reference to FIG. 7. The process begins at step 1301 in which the function and performance characteristics of a semiconductor device are designed or otherwise determined. Next, in step 1302, a reticle (mask) in which has a pattern is designed based upon the design of the semiconductor device. It should be appreciated that in a parallel step 1303, a wafer is made from a silicon material. The mask pattern designed in step 1302 is exposed onto the wafer fabricated in step 1303 in step 1304 by a photolithography system. One process of exposing a mask pattern onto a wafer will be described below with respect to FIG. 8. In step 1305, the semiconductor device is assembled. The assembly of the semiconductor device generally includes, but is not limited to, wafer dicing processes, bonding processes, and packaging processes. Finally, the completed device is inspected in step 1306.

Figure 8:
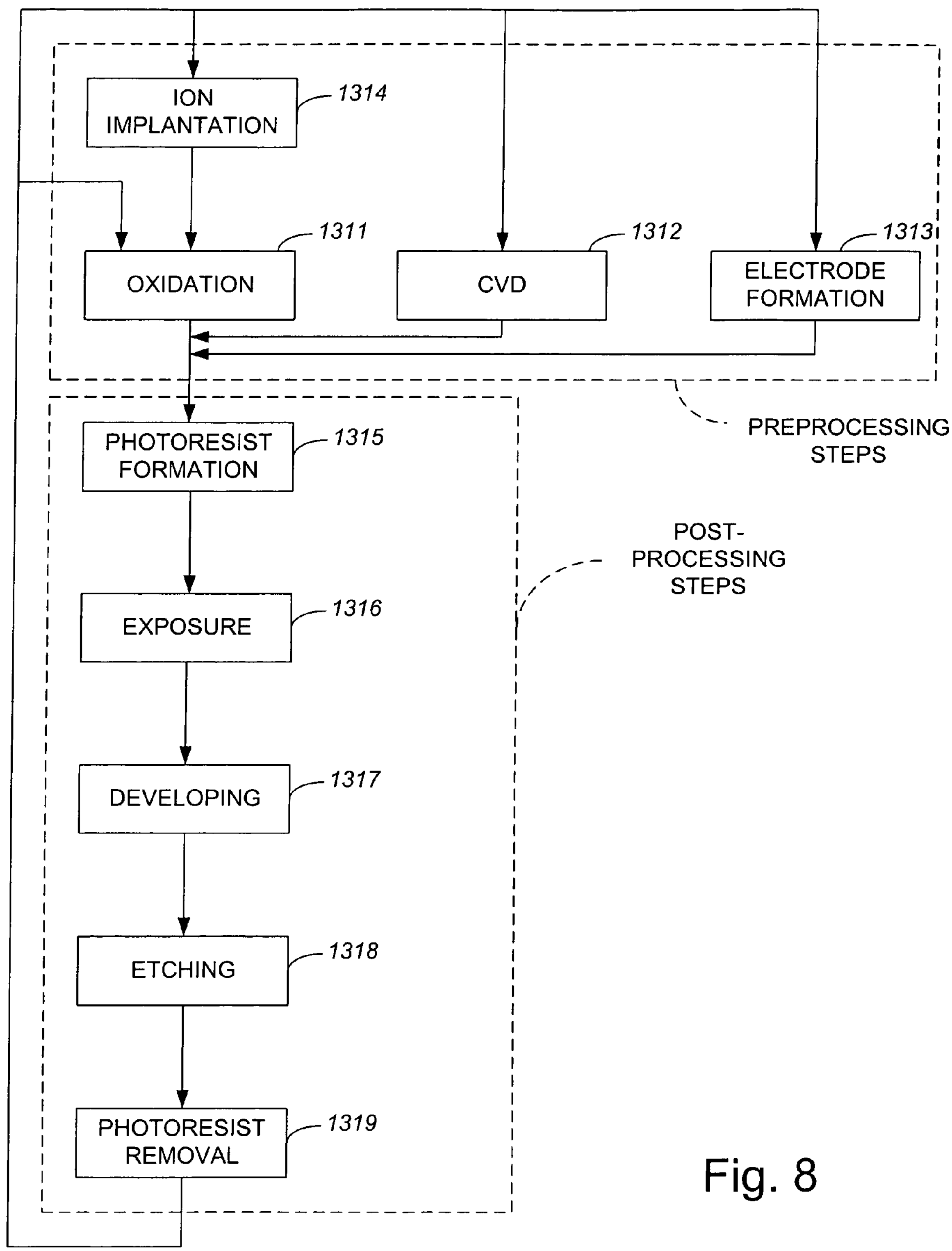
FIG. 8 is a process flow diagram which illustrates the steps associated with processing a wafer, i.e., step 1304 of FIG. 7, in accordance with an embodiment of the present invention.

FIG. 8 is a process flow diagram which illustrates the steps associated with wafer processing in the case of fabricating semiconductor devices in accordance with an embodiment of the present invention. In step 1311, the surface of a wafer is oxidized. Then, in step 1312 which is a chemical vapor deposition (CVD) step, an insulation film may be formed on the wafer surface. Once the insulation film is formed, in step 1313, electrodes are formed on the wafer by vapor deposition. Then, ions may be implanted in the wafer using substantially any suitable method in step 1314. As will be appreciated by those skilled in the art, steps 1311–1314 are generally considered to be preprocessing steps for wafers during wafer processing. Further, it should be understood that selections made in each step, e.g., the concentration of various chemicals to use in forming an insulation film in step 1312, may be made based upon processing requirements.

At each stage of wafer processing, when preprocessing steps have been completed, post-processing steps may be implemented. During post-processing, initially, in step 1315, photoresist is applied to a wafer. Then, in step 1316, an exposure device may be used to transfer the circuit pattern of a reticle to a wafer. Transferring the circuit pattern of the reticle of the wafer generally includes scanning a reticle scanning stage which may, in one embodiment, include a force damper to dampen vibrations.

After the circuit pattern on a reticle is transferred to a wafer, the exposed wafer is developed in step 1317. Once the exposed wafer is developed, parts other than residual photoresist, e.g., the exposed material surface, may be removed by etching. Finally, in step 1319, any unnecessary photoresist that remains after etching may be removed. As will be appreciated by those skilled in the art, multiple circuit patterns may be formed through the repetition of the preprocessing and post-processing steps.

Although only a few embodiments of the present invention have been described, it should be understood that the present invention may be embodied in many other specific forms without departing from the spirit or the scope of the present invention. By way of example, while the use of a cooled gas to establish thermophoretic forces between a reticle and a reticle shield has been described, a cooled gas may be used in proximity to a wafer surface to establish thermophoretic forces to keep particles from being attracted to the wafer surface. In addition, the introduction of a cooled gas flow in proximity to a wafer surface may further enable outgassing products of the wafer surface to be conveyed away from the wafer surface.

A gas that is to be introduced into a space between a reticle and a reticle shield has generally been described as being cooled by coolers that are in proximity to openings in the reticle shield. That is, a cooled gas has been described as being locally cooled. It should be appreciated, however, that a gas may be cooled by substantially any suitable mechanism in a suitable location. In addition, the gas may be any suitable gas, as for example a light gas such as helium or hydrogen.

Substantially any suitable mechanism may be used to maintain the temperature of the reticle and the temperature of a reticle shield at a temperature that is warmer than the temperature of a cooled gas that is provided in the space defined between the reticle and the reticle shield. The configuration of such suitable mechanisms may generally vary widely.

A reticle and a barrier or a reticle shield have been described as having substantially the same temperature. In one embodiment, the reticle and the barrier may have different temperatures that are warmer than the temperature of a cooled gas introduced into a space between the reticle and the barrier. That is, the reticle and the barrier may have slightly different temperatures as long as the different temperatures are both higher than the temperature of the cooled gas provided between the reticle and the barrier without departing from the spirit or the scope of the present invention. Therefore, the present examples are to be considered as illustrative and not restrictive, and the invention is not to be limited to the details given herein, but may be modified within the scope of the appended claims.

What is claimed is:

1. An apparatus arranged to reduce particle contamination on a surface of an object, the apparatus comprising:

a member having a surface proximate to the object, the member being arranged in proximity to the object such that the member and the object are substantially separated by a space, wherein the object is of a first temperature and the member is of a second temperature; and a gas supply, the gas supply being arranged to supply a gas flow to the space, the gas having in the space a temperature distribution the minimum of which is lower than the first temperature and lower than the second temperature, wherein the gas is arranged to cooperate with the member and the object to create a thermophoretic force to convey any particles in the space away from the object.

2. The apparatus of claim 1 wherein the member includes at least a first opening defined therein, the first opening being arranged to enable the gas flow to pass therethrough and into the space.

3. The apparatus of claim 2 wherein the member includes a second opening defined therein, the second opening being arranged to enable the gas flow to pass therethrough and out of the space to convey the particles in the space away from the object and away from the member.

4. The apparatus of claim 3 wherein the second opening is further arranged to enable a beam of extreme ultraviolet radiation to pass therethrough and onto the surface of the object.

5. The apparatus of claim 2 further including:

a cooling arrangement, the cooling arrangement being coupled to the gas supply to cool the gas to the third temperature before the gas flow passes through the first opening.

6. The apparatus of claim 5 wherein the cooling arrangement is arranged in proximity to the first opening.

7. The apparatus of claim 2 wherein the member further includes a nozzle, the nozzle being defined substantially about the first opening.

8. The apparatus of claim 1 further including:

a stage arrangement, the stage arrangement being arranged to enable the object to scan; and a chuck, the chuck being coupled to the stage arrangement and arranged to support the object.

9. The apparatus of claim 8 wherein the stage arrangement includes at least one skirt, the at least one skirt having a surface that is at substantially a same level as a surface of the object.

10. The apparatus of claim 1 wherein the first temperature and the second temperature are approximately the same.

11. The apparatus of claim 1 wherein the member is a plate.

12. The apparatus of claim 1 further including:

a source of extreme ultraviolet radiation, the source of extreme ultraviolet radiation being arranged to provide an extreme ultraviolet beam to the surface of the object through an opening defined within the member, wherein the object is a reticle and the member is a reticle shield arranged to protect the surface of the reticle during an extreme ultraviolet lithography process.

13. A device manufactured with the apparatus of claim 12.

14. A wafer on which an image has been formed using the apparatus of claim 12.

15. The apparatus of claim 1, further comprising a chamber to hold the object, the chamber further including a vacuum pump to maintain the pressure in the chamber at a predetermined pressure.

16. The apparatus of claim 2, wherein the gas exiting the first opening exits at a pressure that is higher than the pressure in the space, the higher pressure causing the gas to cool as it expands into the space, thereby creating the temperature distribution in the space.

17. The apparatus of claim 1, further comprising a filter located adjacent the first opening, the filter configured to remove particles from the gas supply from entering the space.

18. A method for reducing particle contamination on a surface of an object, the method comprising:

providing a shield in proximity to the surface of the object, the shield being positioned such that there is a space defined between the surface of the object and the shield, the shield having a first opening defined therein, wherein the surface of the object is of a first temperature and the shield is of a second temperature; and providing a flow of a gas in the space defined between the surface of the object and the shield, the gas having in the space a temperature distribution the minimum of which is lower than both the first temperature and the second temperature, wherein the flow of the gas is provided through the first opening.

19. The method of claim 18 wherein the flow of the gas in the space defined between the surface of the object and the shield is arranged to create a temperature gradient in the space that enables the flow of the gas to convey any particles in the space away from the surface of the object.

20. The method of claim 19 wherein the flow of the gas further conveys the particles in the space away from the shield.

21. The method of claim 19 wherein the shield has a second opening defined therein, and wherein the flow of the gas conveys the particles in the space away from the surface of the object through the second opening.

22. The method of claim 21 further including:

providing a beam through the second opening defined in the shield, the beam being arranged to substantially illuminate an area of the surface of the object.

23. The method of claim 18 wherein providing the flow of the gas in the space defined between the surface of the object and the shield includes:

cooling the gas to the third temperature; and controlling the amount of the gas that flows through the first opening.

24. The method of claim 18 wherein the object is a reticle and shield is a reticle shield.

25. The method of claim 24 wherein the reticle is arranged to be used with an extreme ultraviolet lithography process.

26. An apparatus arranged to reduce particle contamination on a surface of an object, the apparatus comprising:

a chamber, the chamber having a first region and a second region, the first region having a pressure of at least approximately 50 mTorr, the second region having a pressure that is less than the pressure of the first region;

a first scanning arrangement, the first scanning arrangement being arranged to scan the object, the first scanning arrangement being arranged in the first region, wherein the first scanning arrangement includes a member, the member being arranged in proximity to a first surface of the object such that a first surface of the member and the first surface of the object are substantially separated by a space in the first region, wherein the first surface of the object is of a first temperature and the first surface of the member is of a second temperature; and a gas supply, the gas supply being arranged to supply a gas flow to the space, the gas having in the space a temperature distribution the minimum of which is lower than the first temperature and lower than the second temperature, wherein the gas is arranged to cooperate with the member and the object to create a thermophoretic force to convey any particles in the space away from the object.

27. The apparatus of claim 26 wherein the object is an extreme ultraviolet reticle, and the apparatus further includes:

a second scanning arrangement, the second scanning arrangement being arranged to scan a wafer, the second scanning arrangement being arranged in the second region, wherein the pressure of the second region is less than approximately 1 mTorr.

28. The apparatus of claim 27 wherein a first opening is defined in the member, and an extreme ultraviolet beam is arranged to pass through the first opening to reflect off the object and onto the wafer.

29. The apparatus of claim 26 wherein the member includes at least a first opening defined therein, the first opening being arranged to enable the gas flow to pass therethrough and into the space.

30. The apparatus of claim 29 wherein the member further includes a nozzle, the nozzle being arranged substantially about the first opening.

31. The apparatus of claim 29 wherein the member includes a second opening defined therein, the second opening being arranged to enable the gas flow to pass therethrough and out of the space to convey the particles in the space away from the object and into the second region.

32. The apparatus of claim 31 wherein the second opening is further arranged to enable a beam of extreme ultraviolet radiation to pass therethrough and onto the surface of the object.

33. The apparatus of claim 29 further including:

a cooling arrangement, the cooling arrangement being coupled to the gas supply to cool the gas to the third temperature before the gas flow passes through the first opening.

34. The apparatus of claim 33 wherein the cooling arrangement is arranged in proximity to the first opening.

35. The apparatus of claim 26 wherein the first temperature and the second temperature are approximately the same.

36. The apparatus of claim 27 further including:

a source of extreme ultraviolet radiation, the source of extreme ultraviolet radiation being arranged to provide an extreme ultraviolet beam to the surface of the object through an opening defined within the member, wherein the object is a reticle and the member is a reticle shield arranged to protect the surface of the reticle during an extreme ultraviolet lithography process.

37. A device manufactured with the apparatus of claim 36.

38. A wafer on which an image has been formed using the apparatus of claim 36.

* * * * *